US012588332B2

(12) United States Patent
Kim et al.

(10) Patent No.: US 12,588,332 B2
(45) Date of Patent: Mar. 24, 2026

(54) DISPLAY DEVICE HAVING COLOR CONVERSION AND COLOR REINFORCEMENT PATTERNS

(71) Applicant: Samsung Display Co., LTD., Yongin-si (KR)

(72) Inventors: Soodong Kim, Suwon-si (KR); Sunyoung Kwon, Seoul (KR); Youngsoo Kwon, Hwaseong-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 440 days.

(21) Appl. No.: 18/071,894

(22) Filed: Nov. 30, 2022

(65) Prior Publication Data

US 2023/0352637 A1 Nov. 2, 2023

(30) Foreign Application Priority Data

Apr. 27, 2022 (KR) ........................ 10-2022-0051981

(51) Int. Cl.
*H10H 20/851* (2025.01)
*H10H 29/14* (2025.01)
(Continued)

(52) U.S. Cl.
CPC .... *H10H 20/8514* (2025.01); *H10H 20/8512* (2025.01)

(58) Field of Classification Search
CPC ........... H10H 20/8512; H10H 20/5816; H10H 20/8513; H10H 20/8514; H10K 59/38; H10K 59/80518; H10K 59/876; H10K 50/115; H10K 50/113; H10K 50/852; H10K 50/818; H10K 50/828; H10K 2102/351; G02B 5/201; G02B 5/226; G02B 5/223; G02B 5/285
See application file for complete search history.

(56) References Cited

U.S. PATENT DOCUMENTS

| | | | | |
|---|---|---|---|---|
| 10,768,470 | B2 | 9/2020 | Park et al. | |
| 11,004,835 | B2 * | 5/2021 | Pschenitzka | H10H 20/825 |

(Continued)

FOREIGN PATENT DOCUMENTS

| | | | |
|---|---|---|---|
| JP | 2017203810 A | * 11/2017 | |
| KR | 1020160098185 A | 8/2016 | |

(Continued)

OTHER PUBLICATIONS

Serway, Physics for Scientists and Engineers, 7th Ed, pp. 966-968 (Year: 2007).*

(Continued)

*Primary Examiner* — Monica D Harrison
*Assistant Examiner* — Moataz Khalifa
(74) *Attorney, Agent, or Firm* — CANTOR COLBURN LLP

(57) ABSTRACT

A display device includes a color conversion pattern including first red quantum dots, a color reinforcement pattern adjacent to the color conversion pattern and including second red quantum dots, and an emission layer disposed on the color reinforcement pattern. A concentration of the second red quantum dots in the color reinforcement pattern is less than a concentration of the first red quantum dots in the color conversion pattern.

29 Claims, 15 Drawing Sheets

(51) Int. Cl.

| | |
|---|---|
| ***H10K 50/115*** | (2023.01) |
| ***H10K 50/13*** | (2023.01) |
| ***H10K 50/858*** | (2023.01) |
| ***H10K 50/86*** | (2023.01) |
| ***H10K 59/38*** | (2023.01) |

(56) References Cited

U.S. PATENT DOCUMENTS

| | | | | |
|---|---|---|---|---|
| 2013/0256742 | A1* | 10/2013 | Harkness | C08L 83/04 524/783 |
| 2015/0146161 | A1* | 5/2015 | Rigato | G02C 7/02 351/159.6 |
| 2016/0318063 | A1* | 11/2016 | Kim | B05C 21/005 |
| 2016/0327690 | A1 | 11/2016 | Tokinoya et al. | |
| 2019/0093008 | A1 | 3/2019 | Shin et al. | |
| 2019/0296088 | A1 | 9/2019 | Kim et al. | |
| 2021/0074770 | A1* | 3/2021 | Choe | G02B 5/206 |
| 2021/0324268 | A1* | 10/2021 | Yang | G02B 6/005 |
| 2021/0399266 | A1* | 12/2021 | Lee | H10K 50/865 |
| 2022/0109128 | A1* | 4/2022 | Fukagawa | G02B 5/223 |

FOREIGN PATENT DOCUMENTS

| | | | |
|---|---|---|---|
| KR | 10-1809259 | | 12/2017 |
| KR | 10-1975350 | | 5/2019 |
| KR | 1020190110660 | A | 10/2019 |
| KR | 1020190115131 | A | 10/2019 |
| KR | 10-2020-0036235 | | 4/2020 |
| KR | 10-2020-0075511 | | 6/2020 |
| KR | 1020200105052 | A | 9/2020 |
| KR | 10-2021-0030538 | | 3/2021 |
| KR | 1020210113943 | A | 9/2021 |
| KR | 10-2021-0133664 | | 11/2021 |

OTHER PUBLICATIONS

Serway, Physics for Scientists and Engineers, 7th Ed, pp. 993-994 (Year: 2007).*

Korean International Search Report for International Application No. PCT/KR2023/002209, dated May 22, 2023.

Office Action dated Jan. 13, 2026 for Korean Patent Application No. 10-2022-0051981, 18 pages (w/English-language translation).

* cited by examiner

DISPLAY DEVICE HAVING COLOR CONVERSION AND COLOR REINFORCEMENT PATTERNS

CROSS-REFERENCE TO RELATED APPLICATION(S)

This application claims priority to and benefits of Korean Patent Application No. 10-2022-0051981 under 35 U.S.C. § 119, filed on Apr. 27, 2022, in the Korean Intellectual Property Office (KIPO), the entire contents of which are incorporated herein by reference.

BACKGROUND

1. Technical Field

The disclosure relates to a display device.

2. Description of the Related Art

A display device includes an emission layer and a plurality of color conversion patterns. Light is emitted from the emission layer, and the color conversion patterns convert the color of the light.

The color conversion patterns may include quantum dots, and may include a red color conversion pattern, a green color conversion pattern, a blue color conversion pattern, and a scattering pattern. The red color conversion pattern implements a red pixel, the green color conversion pattern implements a green pixel, the blue color conversion pattern implements a blue pixel, and the scattering pattern implements a white pixel.

SUMMARY

Embodiments provide a display device.

A display device according to an embodiment may include a color conversion pattern disposed on a substrate and including first red quantum dots, a color reinforcement pattern disposed on the substrate adjacent to the color conversion pattern and including second red quantum dots, and an emission layer disposed on the color reinforcement pattern. A concentration of the second red quantum dots in the color reinforcement pattern may be less than a concentration of the first red quantum dots in the color conversion pattern.

In an embodiment, the concentration of the second red quantum dots in the color reinforcement pattern may be in a range of about 1 wt % to about 40 wt %.

In an embodiment, the color reinforcement pattern may further include a monomer and a dispersant.

In an embodiment, the monomer may include at least one selected from the group consisting of an epoxy-based monomer and an ester-based monomer.

In an embodiment, a terminal of the monomer may include at least one selected from the group consisting of acrylate, diacrylate, and methacrylate.

In an embodiment, a surface energy of the monomer may be in a range of about 1 dyne/cm to about 30 dyne/cm.

In an embodiment, a viscosity of the monomer may be in a range of about 1 cps to about 40 cps.

In an embodiment, the dispersant may include at least one selected from the group consisting of polyacrylate polymer, polyurethane polymer, and polyethylene polymer.

In an embodiment, the second red quantum dots and the first red quantum dots may include a same material.

In an embodiment, a thickness of the color reinforcement pattern in a cross-sectional view may be in a range of about 1 um to about 15 um.

In an embodiment, the display device may further include a light absorption filter disposed between the substrate and the color reinforcement pattern and absorbing light in a wavelength band.

In an embodiment, the wavelength band may be in a range of about 550 nm to about 620 nm.

In an embodiment, the light absorption filter may include a dipyrromethene-based compound.

In an embodiment, the light absorption filter may further include particles formed of an inorganic material.

In an embodiment, a refractive index of the light absorption filter may be less than a refractive index of the color reinforcement pattern.

In an embodiment, a thickness of the light absorption filter in a cross-sectional view may be in a range of about 1 um to about 10 um.

In an embodiment, the light absorption filter may overlap the color reinforcement pattern in a plan view.

In an embodiment, a transmittance of light having a wavelength in a range of about 550 nm to about 600 nm in a region where the color reinforcement pattern and the light absorption filter overlap may be less than or equal to about 60%.

In an embodiment, a transmittance of light having a wavelength less than about 500 nm or greater than about 650 nm in the region where the color reinforcement pattern and the light absorption filter overlap may be greater than or equal to about 80%.

In an embodiment, a reflectivity of light having a wavelength in a range of about 550 nm to about 600 nm in a region where the color reinforcement pattern and the light absorption filter overlap may be less than or equal to about 10%.

In an embodiment, the display device may further include a color filter disposed between the substrate and the color conversion pattern. The light absorption filter may be disposed on the color filter and may overlap the color conversion pattern and the color reinforcement pattern in a plan view.

In an embodiment, the display device may further include a color filter disposed between the light absorption filter and the color conversion pattern and a low refractive layer disposed on the color filter. The light absorption filter may overlap the color conversion pattern and the color reinforcement pattern in a plan view.

In an embodiment, the display device may further include an auxiliary light absorption filter disposed between the color reinforcement pattern and the emission layer.

In an embodiment, the display device may further include an auxiliary light absorption filter disposed on the emission layer.

In an embodiment, the display device may further include a color filter disposed between the substrate and the color conversion pattern. The light absorption filter may overlap the color reinforcement pattern in a plan view and may not overlap the color filter in the plan view.

In an embodiment, the display device may further include an auxiliary light absorption filter disposed between the color reinforcement pattern and the emission layer.

In an embodiment, the display device may further include an auxiliary light absorption filter disposed on the emission layer and overlapping the light absorption filter in the plan view and a metal layer disposed on the emission layer and covering the auxiliary light absorption filter.

A display device according to another embodiment may include a light absorption filter disposed on a substrate and absorbing light in a wavelength band, a color conversion pattern disposed on the light absorption filter, and an emission layer disposed on the color conversion pattern.

In an embodiment, the wavelength band may be in a range of about 550 nm to about 650 nm.

In an embodiment, the light absorption filter may include a dipyrromethene-based compound.

A display device according to an embodiment may include an emission layer disposed on a substrate, a color conversion pattern disposed on the emission layer and including first red quantum dots, and a color reinforcement pattern disposed on the emission layer adjacent to the color conversion pattern and including second red quantum dots. A concentration of the first red quantum dots in the color conversion pattern may be greater than a concentration of the second red quantum dots in the color reinforcement pattern.

In an embodiment, the display device may further include a light absorption filter disposed on the color reinforcement pattern and absorbing light in a wavelength band.

In an embodiment, the display device may further include a color filter disposed on the light absorption filter. The light absorption filter may overlap the color conversion pattern and the color reinforcement pattern in a plan view.

In an embodiment, the display device may further include a color filter disposed on the color conversion pattern. The light absorption filter may overlap the color reinforcement pattern in a plan view and may not overlap the color filter in the plan view.

In an embodiment, the display device may further include a low refractive layer disposed between the color reinforcement pattern and the light absorption filter.

Therefore, a display device according to embodiments of the disclosure may include a red color conversion pattern, a green color conversion pattern, a blue color conversion pattern, a color reinforcement pattern, and a light absorption filter. The red color conversion pattern, the green color conversion pattern, and the blue color conversion pattern may be disposed in the RGB pixel region, and the color reinforcement pattern may be disposed in the W pixel. The red color conversion pattern and the color reinforcement pattern may include red quantum dots, and the concentration of the red quantum dots in the color reinforcement pattern may be less than the concentration of the red quantum dots in the red color conversion pattern. The light absorption filter may mainly absorb light in a wavelength band (e.g., a wavelength band corresponding to yellow).

Due to the color reinforcement pattern, the light of the W pixel region may have high intensity in the wavelength band of the red light. The transmittance and reflectivity of light in a wavelength band corresponding to yellow may be reduced by the light absorption filter. Accordingly, the color coordinate deviation between the color coordinates of the light emitted from the RGB pixel region and the color coordinates of the light emitted from the W pixel may be reduced.

The light absorption filter may be formed only in the W pixel. Accordingly, the light efficiency of the RGB pixel region may be improved.

BRIEF DESCRIPTION OF THE DRAWINGS

The accompanying drawings, which are included to provide a further understanding of the disclosure and are incorporated in and constitute a part of this specification, illustrate embodiments of the disclosure together with the description.

DETAILED DESCRIPTION OF THE EMBODIMENTS

Figure 1:
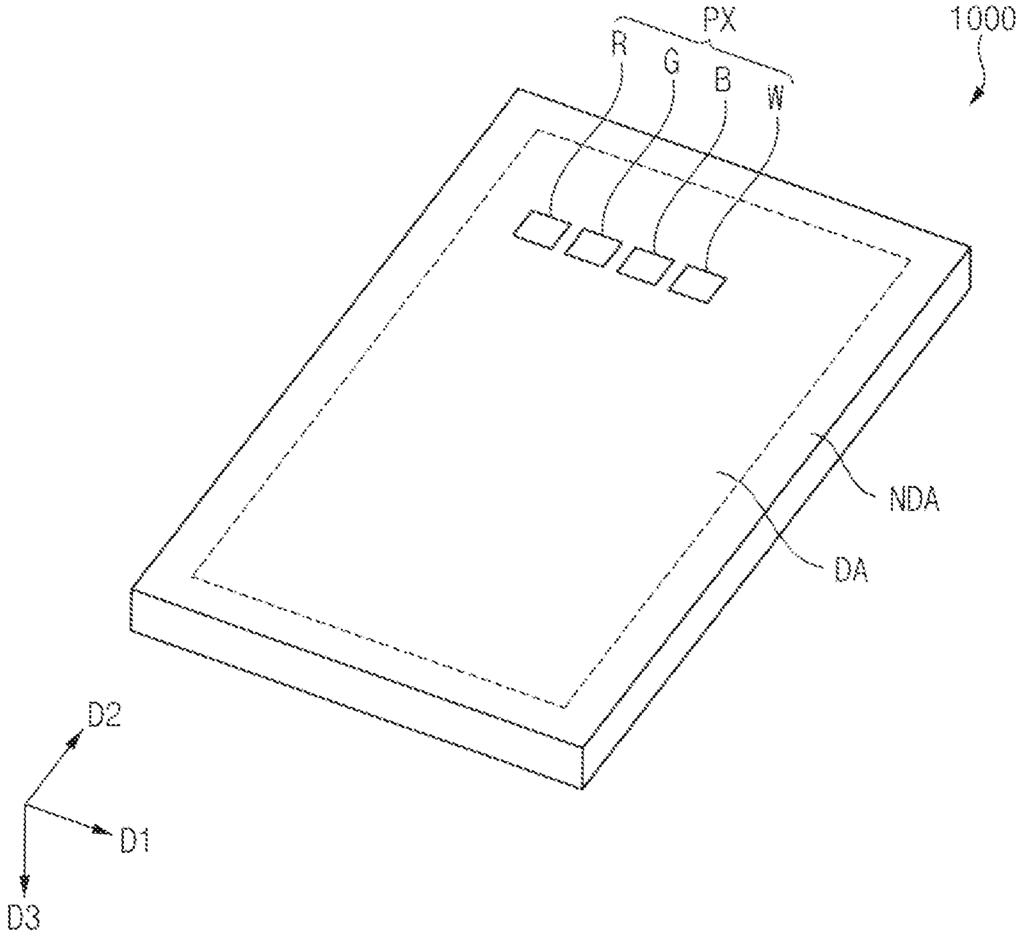
FIG. 1 is a perspective view illustrating a display device according to an embodiment of the disclosure.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below", for example, can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Illustrative, non-limiting embodiments will be more clearly understood from the following detailed description in conjunction with the accompanying drawings.

Figure 2:
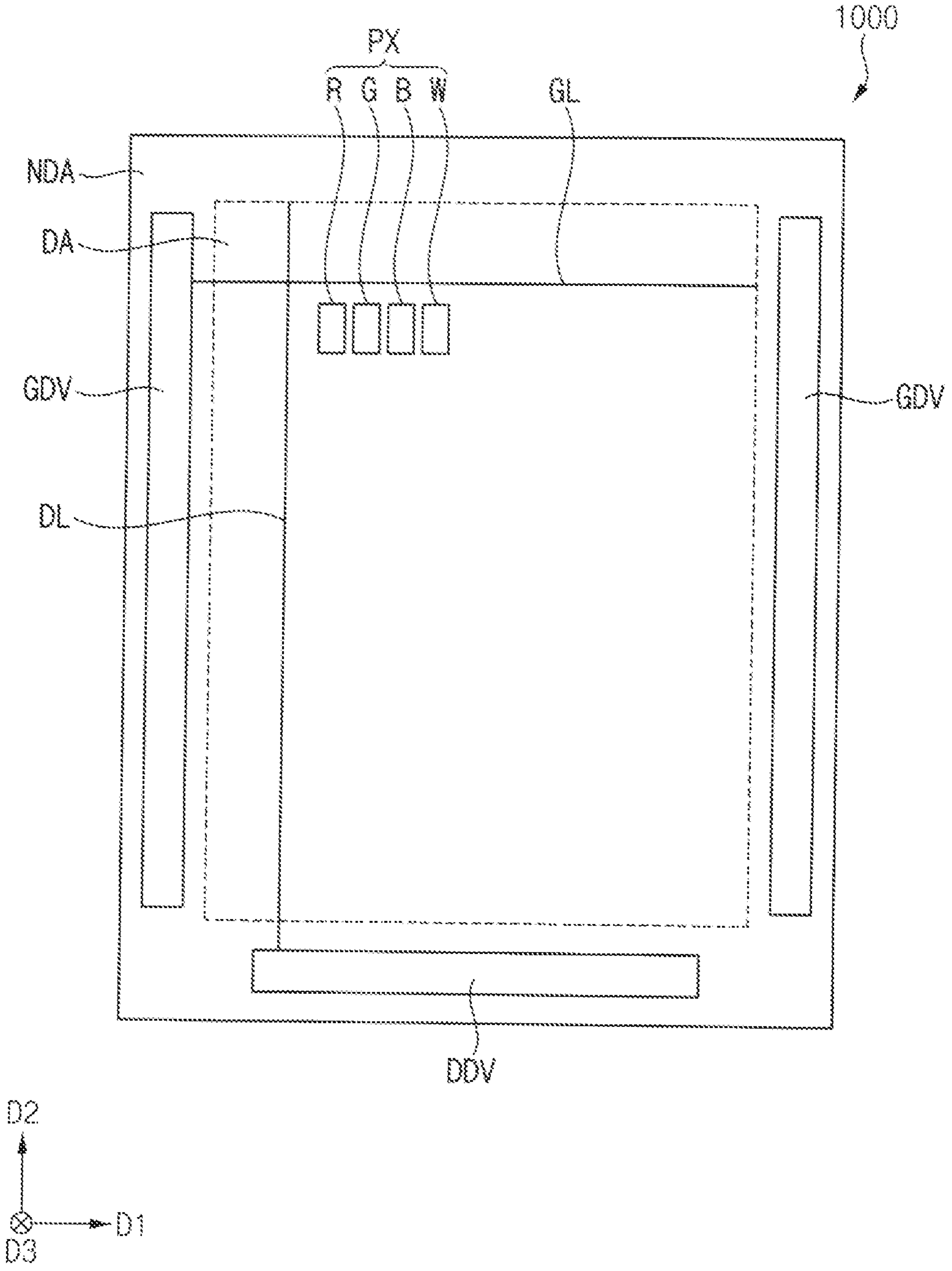
FIG. 2 is a plan view illustrating the display device of FIG. 1.
Figure 3:
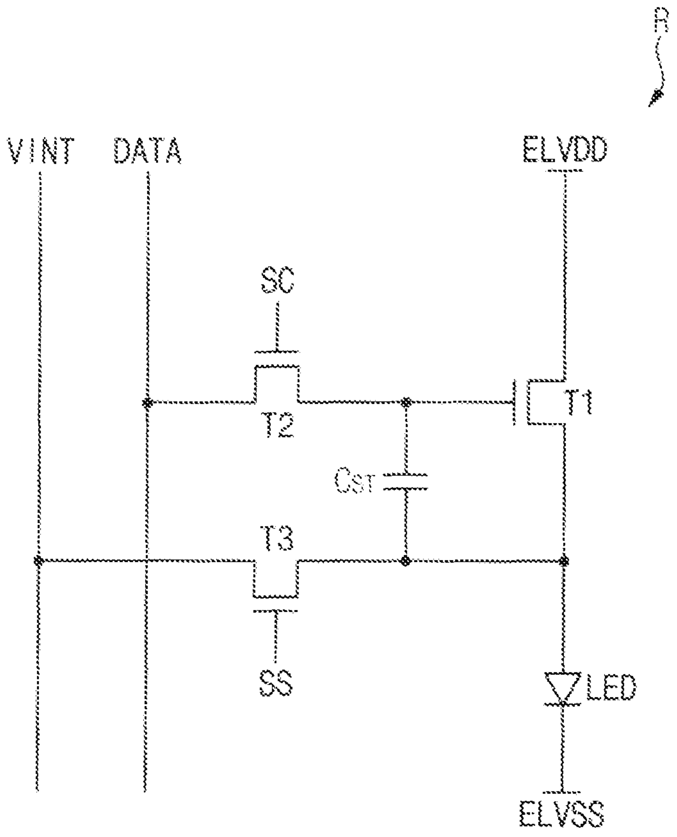
FIG. 3 is a schematic diagram of an equivalent circuit of a sub-pixel included in the display device of FIG. 1.

FIG. 1 is a perspective view illustrating a display device according to an embodiment of the disclosure. FIG. 2 is a plan view illustrating the display device of FIG. 1. FIG. 3 is a schematic diagram of an equivalent circuit of a sub-pixel included in the display device of FIG. 1.

Referring to FIGS. 1 and 2, a display device 1000 according to an embodiment may be divided into a display area DA and a non-display area NDA.

In an embodiment, the display area DA may have a shape (e.g., a rectangular shape). The non-display area NDA may be adjacent to the display area DA. For example, the non-display area NDA may be positioned to surround the display area DA.

A pixel PX, a gate line GL, and a data line DL may be disposed in the display area DA.

The pixel PX may include multiple sub-pixels. In an embodiment, the pixel PX may include a first sub-pixel R, a second sub-pixel G, a third sub-pixel B, and a fourth sub-pixel W. For example, the first sub-pixel R may emit red light, the second sub-pixel G may emit green light, the third sub-pixel B may emit blue light, and the fourth sub-pixel W may emit white light.

The gate line GL may extend in a first direction D1 and may transmit a gate signal to the first to fourth sub-pixels R, G, B, and W. The data line DL may extend in a second direction D2 crossing the first direction D1, and may transmit data voltages to the first to fourth sub-pixels R, G, B, and W.

A gate driver GDV and a data driver DDV may be disposed in the non-display area NDA. The gate driver GDV may be electrically connected to the gate line GL and may generate a gate signal. The data driver DDV may be electrically connected to the data line DL and may generate a data voltage.

Referring to FIG. 3, the first sub-pixel R may include a first transistor T1, a second transistor T2, a third transistor T3, a storage capacitor CST, and a light emitting diode LED. Each of the second to fourth sub-pixels G, B, and W may have substantially the same circuit structure as the first sub-pixel R.

The first transistor T1 may include a gate terminal, a first terminal, and a second terminal. The gate terminal may be electrically connected to the second transistor T2. The first terminal may be electrically connected to a first power voltage ELVDD. The second terminal may be electrically connected to the light emitting diode LED. The first transistor T1 may provide a driving current for driving the light emitting diode LED.

The second transistor T2 may include a gate terminal, a first terminal, and a second terminal. The gate terminal may receive a first gate signal SC. The first terminal may receive the data voltage DATA. The second terminal may be electrically connected to the first transistor T1. The second transistor T2 may transmit the data voltage DATA in response to the first gate signal SC.

The third transistor T3 may include a gate terminal, a first terminal, and a second terminal. The gate terminal may receive a second gate signal SS. The first terminal may receive an initialization voltage VINT. The second terminal may be electrically connected to the light emitting diode LED. The third transistor T3 may transmit the initialization voltage VINT in response to the second gate signal SS.

The storage capacitor CST may include a first terminal and a second terminal. The first terminal may be electrically connected to the gate terminal of the first transistor T1. The second terminal may be electrically connected to the second terminal of the first transistor T1.

The light emitting diode LED may include a first terminal and a second terminal. The first terminal may be electrically connected to the first transistor T1. The second terminal may be electrically connected to a second power voltage ELVSS. The light emitting diode LED may emit light in response to the driving current.

Figure 4:
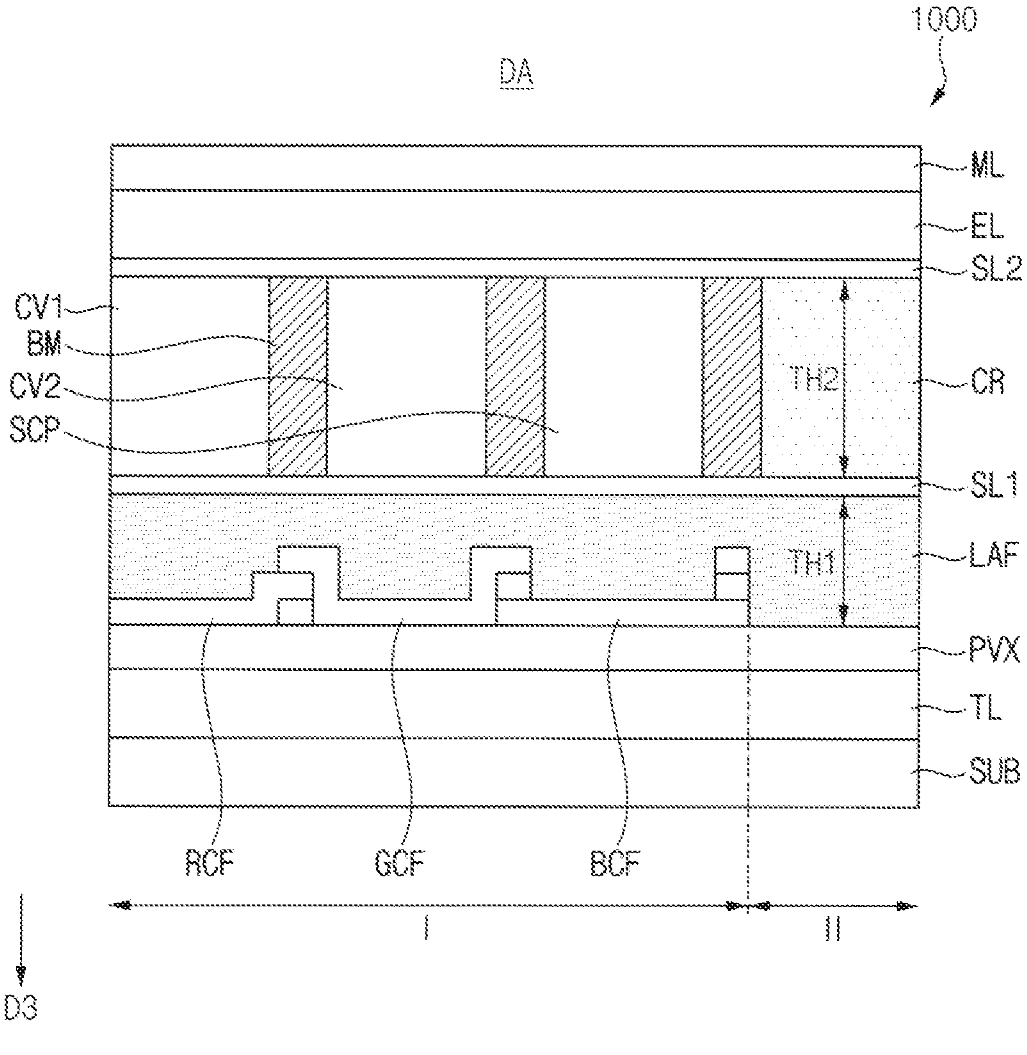
FIG. 4 is a schematic cross-sectional view illustrating the display device of FIG. 1.
Figure 5:
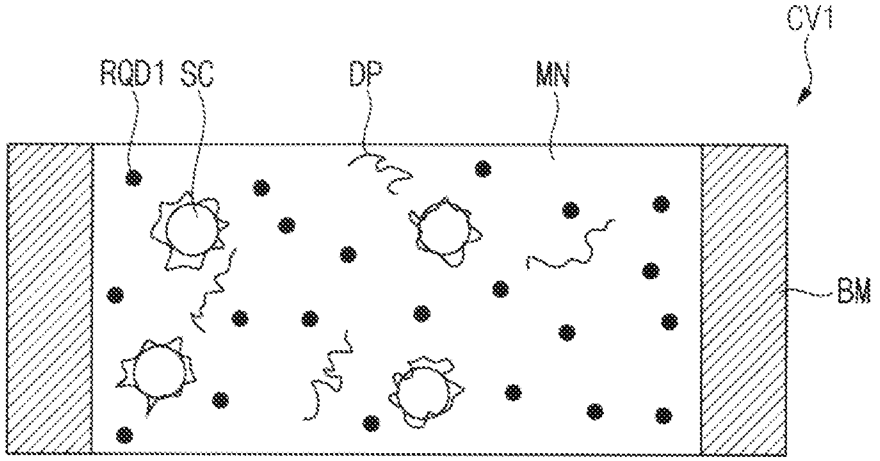
FIG. 5 is an enlarged view illustrating a first color conversion pattern included in the display device of FIG. 4.
Figure 6:
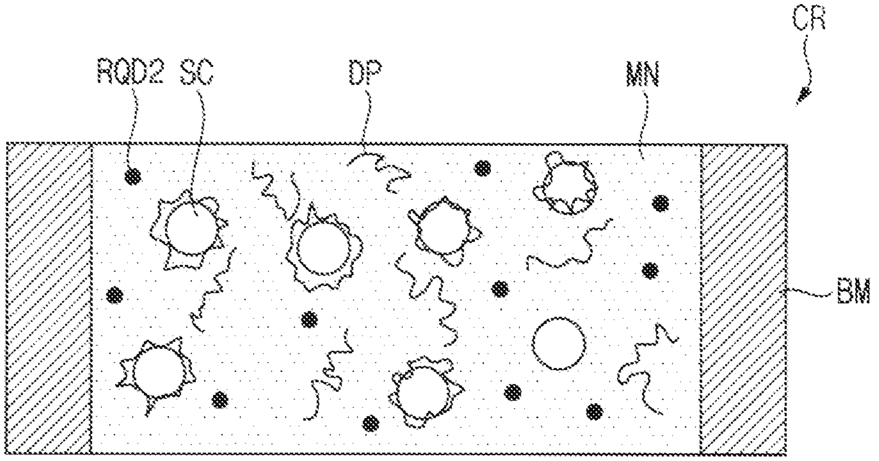
FIG. 6 is an enlarged view illustrating a color reinforcement pattern included in the display device of FIG. 4.

FIG. 4 is a schematic cross-sectional view illustrating the display device of FIG. 1. FIG. 5 is an enlarged view illustrating a first color conversion pattern included in the display device of FIG. 4. FIG. 6 is an enlarged view illustrating a color reinforcement pattern included in the display device of FIG. 4.

Referring to FIG. 4, the display device 1000 may include a substrate SUB, a transistor layer TL, a passivation layer PVX, a first color filter RCF, a second color filter GCF, a third color filter BCF, a light absorption filter LAF, a first separation layer SL1, a light blocking pattern BM, a first color conversion pattern CV1, a second color conversion pattern CV2, a scattering pattern SCP (or, a third color conversion pattern), a color reinforcement pattern CR, a second separation layer SL2, an emission layer EL, and a metal layer ML.

In an embodiment, the light emitted from the emission layer EL may travel in a third direction D3. For example, light emitted from the emission layer EL may sequentially pass through the color reinforcement pattern CR, the light absorption filter LAF, and the substrate SUB. For example, the display device 1000 may be a bottom emission type display device.

The substrate SUB may include a transparent material. Examples of the material that can be used as the substrate SUB may include glass, quartz, plastic, or the like. These may be used alone or in combination with each other.

The transistor layer TL may be disposed on the substrate SUB. The transistor layer TL may include insulating layers and conductive patterns. The conductive patterns may be formed between the insulating layers, and may constitute the transistors.

The passivation layer PVX may be disposed on the transistor layer TL. In an embodiment, the passivation layer PVX may include an inorganic material and/or an organic material. Examples of the inorganic material that may be used for the passivation layer PVX may include silicon oxide, silicon nitride, silicon oxynitride, and the like. Examples of the organic material that can be used for the passivation layer PVX may include photoresist, polyacrylic resin, polyimide resin, acrylic resin, and the like. These may be used alone or in combination with each other.

In an embodiment, as shown in FIG. 4, a region I and a region II may be defined in the display device 1000.

The region I may be a region in which the first to third color filters RCF, GCF, and BCF are disposed. For example, the region I may be referred to as an RGB pixel region. The region I may be a region which does not overlap both the color reinforcement pattern CR and the light absorption filter LAF.

The region II may be a region in which the first to third color filters RCF, GCF, and BCF are not disposed. For example, the region II may be referred to as a W pixel region. The region II may be a region where the color reinforcement pattern CR and the light absorption filter LAF overlap.

The first color filter RCF may be disposed on the passivation layer PVX. In an embodiment, light emitted from the emission layer EL and passing through the first color filter RCF may have a red color. For example, the first color filter RCF may pass only light having a wavelength band corresponding to red.

The second color filter GCF may be disposed on the passivation layer PVX and may be disposed adjacent to the first color filter RCF. In an embodiment, light emitted from the emission layer EL and passing through the second color filter GCF may have a green color. For example, the second color filter GCF may pass only light having a wavelength band corresponding to green.

The third color filter BCF may be disposed on the passivation layer PVX and may be disposed adjacent to the second color filter GCF. In an embodiment, light emitted from the emission layer EL and passing through the third color filter BCF may have a blue color. For example, the third color filter BCF may pass only light having a wavelength band corresponding to blue.

The light absorption filter LAF may be disposed on the passivation layer PVX. In an embodiment, the light absorption filter LAF may be disposed on an entire area of the passivation layer PVX. For example, the light absorption filter LAF may overlap the first color filter RCF, the second color filter GCF, and the third color filter BCF, and may cover the first color filter RCF, the second color filter GCF, and the third color filter BCF.

In an embodiment, the light absorption filter LAF may have a first thickness TH1 in a cross-sectional view, and the first thickness TH1 may be in a range of about 1 um to about 10 um.

In an embodiment, the light absorption filter LAF may mainly absorb light in a wavelength band. For example, the wavelength band may be in a range of about 550 nm to about 620 nm. For example, the light absorption filter LAF may mainly absorb light in a wavelength band corresponding to yellow.

In an embodiment, the light absorption filter LAF may include a dispersant, a dipyrromethene-based compound, and particles. The light absorption filter LAF may also include a leveling agent, a photoinitiator, a UV initiator, a thermal initiator, a thermal curing catalyst, an adhesion imparting agent, a plasticizer, an ultraviolet absorber, an antioxidant, an antistatic agent, an inorganic filler, a pigment, a dye, etc. As the light absorption filter LAF also includes the leveling agent, the light absorption filter LAF may have a substantially flat top surface.

For example, the dispersant may include at least one selected from the group consisting of polyacrylate polymer, polyurethane polymer, polyethylene polymer, epoxy polymer, and ester polymer. Low refractive compound (e.g., silicon (Si), silicon oxide ($SiO_2$), magnesium fluoride ($MgF_2$), etc.) may be bound to the dispersant. Accordingly, the refractive index of the light absorption filter LAF may be reduced.

For example, in case that silicone is bonded to the polyacrylate polymer, the light absorption filter LAF may include a dispersant having a structure of Formula 1 below.

[Formula 1]

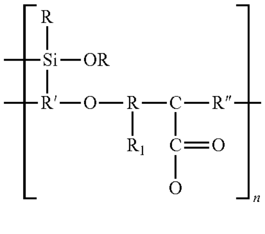

In Formula 1, $R_1$ may be an amine compound or an acid compound. In Formula 1, n may be an integer greater than 1 and less than about 1,000.

For example, in case that silicone is bonded to the polyurethane polymer, the light absorption filter LAF may include a dispersant having a structure of Formula 2 below.

[Formula 2]

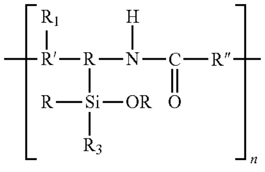

In Formula 2, $R_3$ may be a low refractive compound (e.g., a silicon (Si) compound). In Formula 2, n may be an integer greater than 1 and less than about 1,000.

For example, in case that silicone is bonded to the polyethylene polymer, the light absorption filter LAF may include a dispersant having a structure of Formula 3 below.

[Formula 3]

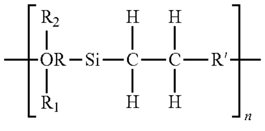

In Formula 3, $R_1$ and $R_2$ may each independently be an amine compound or an acid compound. In Formula 3, n may be an integer greater than 1 and less than about 1,000.

For example, the dipyrromethene-based compound may include a compound having a structure of Formula 4 below. Accordingly, the light absorption filter LAF may mainly absorb light in a wavelength band corresponding to yellow.

[Formula 4]

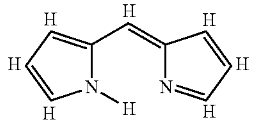

For example, the particle may include an inorganic material. In case that the inorganic material is silicon, silica particles may be included in the light absorption filter LAF.

The first separation layer SL1 may be disposed on the light absorption filter LAF. In an embodiment, the first separation layer SL1 may include an inorganic material and/or an organic material.

The light blocking pattern BM may be disposed on the first separation layer SL1. The light blocking pattern BM may include openings, and the first color conversion pattern CV1, the second color conversion pattern CV2, the scattering pattern SCP, and the color reinforcement pattern CR may be disposed in the openings, respectively.

The first color conversion pattern CV1 may be disposed on the first separation layer SL1. In an embodiment, the first color conversion pattern CV1 may convert the color of the incident light to red. For example, the first color conversion pattern CV1 may convert light emitted from the emission layer EL into red light.

In an embodiment, the first color conversion pattern CV1 may overlap the light absorption filter LAF. The first color conversion pattern CV1 may have a thickness in a range of about 1 um to about 15 um in a cross-sectional view.

Referring to FIG. 5, the first color conversion pattern CV1 may include a monomer MN, a first red quantum dot RQD1, a dispersant DP, and a scatterer SC. The first color conversion pattern CV1 may also include a compound such as a photoinitiator.

The first red quantum dot RQD1 may convert the color of incident light to red. For example, the first red quantum dot RQD1 may be a quantum dot, and may include at least one selected from the group consisting of group II-VI compound, group IV-VI compound, group IV element, group IV compound, and combinations thereof.

Referring back to FIG. 4, the second color conversion pattern CV2 may be disposed on the first separation layer SL1 and may be disposed adjacent to the first color conversion pattern CV1. In an embodiment, the second color conversion pattern CV2 may convert the color of the incident light to green. For example, the second color conversion pattern CV2 may convert light emitted from the emission layer EL into green light.

The scattering pattern SCP or a third color conversion pattern may be disposed on the first separation layer SL1 and may be disposed adjacent to the second color conversion pattern CV2. In an embodiment, the third color conversion pattern may convert the color of the incident light to blue. For example, the third color conversion pattern may convert light emitted from the emission layer EL into blue light. In another embodiment, the scattering pattern SCP may scatter incident light. For example, the scattering pattern SCP may scatter blue light emitted from the emission layer EL.

The color reinforcement pattern CR may be disposed on the first separation layer SL1 and may be disposed adjacent to the scattering pattern SCP. In an embodiment, the color reinforcement pattern CR may have a second thickness TH2 in a cross-sectional view, and the second thickness TH2 may be in a range of about 1 um to about 15 um.

Referring to FIG. 6, the color reinforcement pattern CR may include a monomer MN, a second red quantum dot RQD2, a dispersant DP, and a scatterer SC. The color reinforcement pattern CR may also include a compound such as a photoinitiator.

In an embodiment, a concentration of the second red quantum dots RQD2 included in the color reinforcement pattern CR may be less than a concentration of the first red quantum dots RQD1 included in the first color conversion pattern CV1. For example, the concentration of the second red quantum dots RQD2 included in the color reinforcement pattern CR may be in a range of about 1 wt % to about 40 wt %.

In an embodiment, the monomer MN may include at least one selected from the group consisting of epoxy-based monomer and ester-based monomer.

A terminal of the monomer MN may include at least one selected from the group consisting of acrylate, diacrylate, and methacrylate. For example, in case that the terminal of the monomer MN includes diacrylate, the monomer MN may include a compound having a structure of Formula 5 below.

[Formula 5]

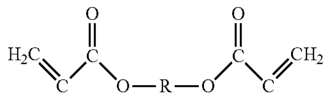

In an embodiment, the surface energy of the monomer MN, at about 10' to about 10-3 mmHg, may be in a range of about 1 dyne/cm to about 30 dyne/cm, and the viscosity of the monomer MN may be in a range of about 1 cps to about 40 cps.

In an embodiment, the second red quantum dot RQD2 and the first red quantum dot RQD1 may include the same material. For example, the second red quantum dot RQD2 may be a quantum dot, and may include at least one selected from the group consisting of group II-VI compound, group IV-VI compound, group IV element, group IV compound, and combinations thereof. The second red quantum dot RQD2 may convert the color of incident light to red.

For example, the dispersant DP may include at least one selected from the group consisting of polyacrylate polymer, polyurethane polymer, polyethylene polymer, epoxy-based polymer, and ester-based polymer.

For example, in case that polyacrylate polymer is used as a dispersant DP, the color reinforcing filter CR may include a dispersant having a structure of Formula 6 below.

[Formula 6]

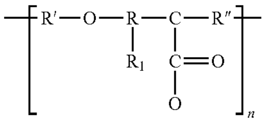

In Formula 6, $R_1$ may be an amine compound or an acid compound. In Formula 6, n may be an integer greater than 1 and less than about 1,000.

For example, in case that polyurethane polymer is used as a dispersant DP, the color reinforcing filter CR may include a dispersant having a structure of Formula 7 below.

[Formula 7]

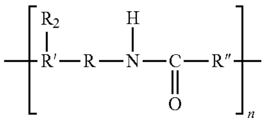

In Formula 7, $R_2$ may be an amine compound or an acid compound. In Formula 7, n may be an integer greater than 1 and less than about 1,000.

For example, in case that polyethylene polymer is used as a dispersant DP, the color reinforcing filter CR may include a dispersant having a structure of Formula 8 below.

[Formula 8]

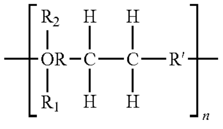

In Formula 8, $R_1$ and $R_2$ may be an amine compound or an acid compound. In Formula 8, n may be an integer greater than 1 and less than about 1,000.

For example, the scatterer SC may include at least one selected from the group consisting of titanium dioxide ($TiO_2$), zinc oxide (ZnO), aluminum oxide ($Al_2O_3$), silicon oxide ($SiO_2$), and hollow silica.

The color reinforcement pattern CR may also include a photoinitiator, and the photoinitiator may be TPO, Lucirin TPO-L, oxime ester, or the like.

Referring back to FIG. 4, the second separation layer SL2 may be disposed on the first color conversion pattern CV1, the second color conversion pattern CV2, the scattering pattern SCP, and the color reinforcement pattern CR.

The emission layer EL may be disposed on the second separation layer SL2. The emission layer EL may emit light. For example, the emission layer EL may have a structure in which a first organic emission layer emitting blue light, a second organic emission layer emitting yellow light, and a third organic emission layer emitting blue light are sequentially stacked.

The metal layer ML may be disposed on the emission layer EL. The metal layer ML may serve as a reflector. Accordingly, the light emitted from the emission layer EL may travel in the third direction D3.

Figure 7:
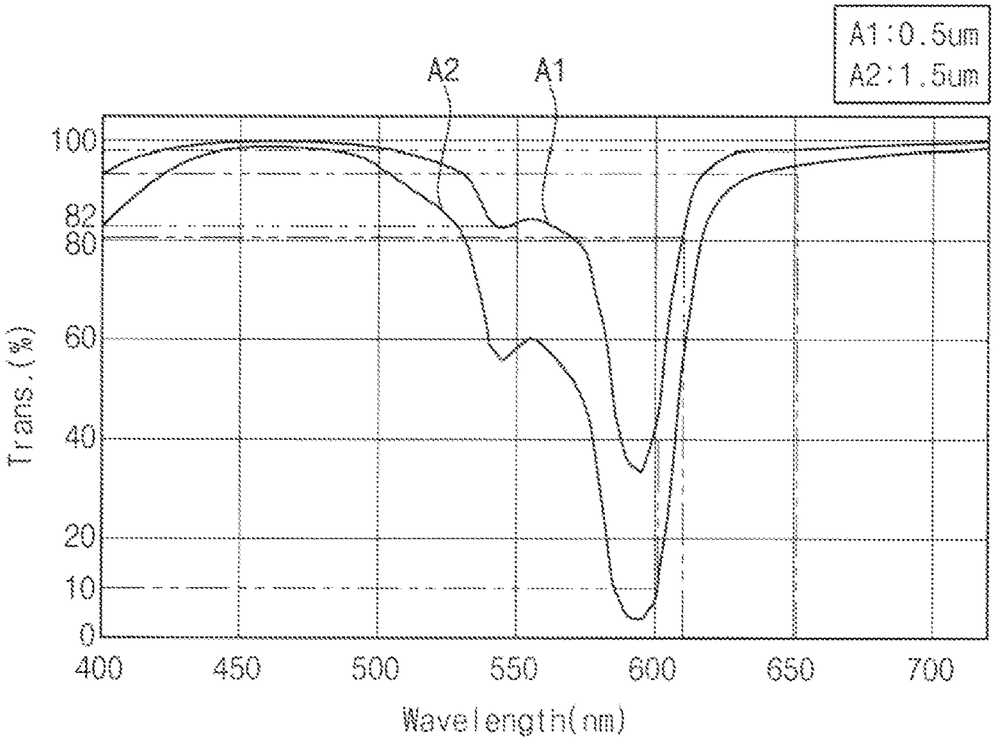
FIG. 7 is a graph showing a transmittance of light based on wavelength bands measured in region II of FIG. 4.
Figure 8:
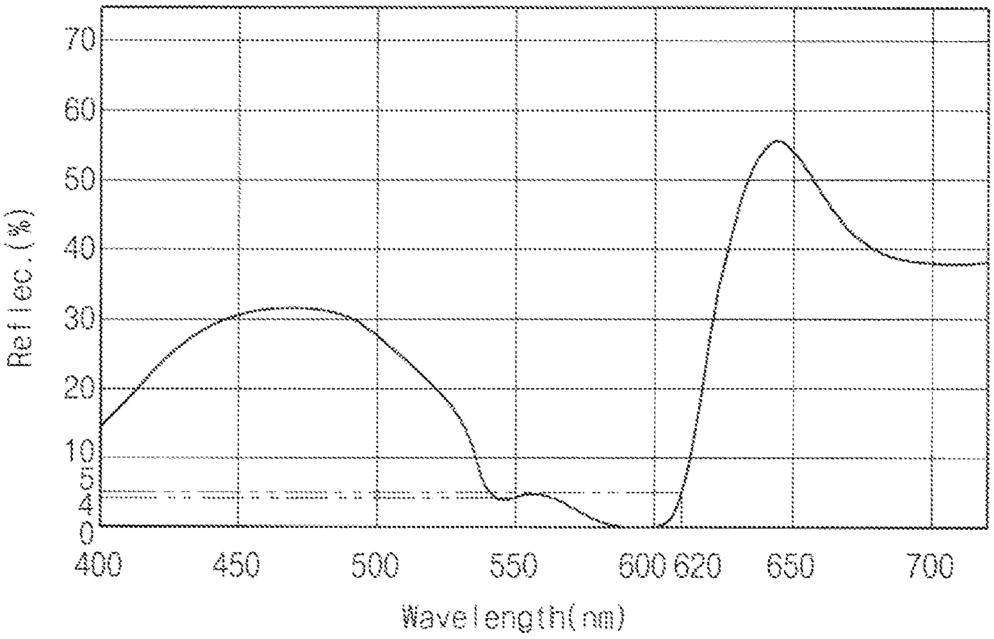
FIG. 8 is a graph showing a reflectivity of light based on wavelength bands measured in region II of FIG. 4.
Figure 9:
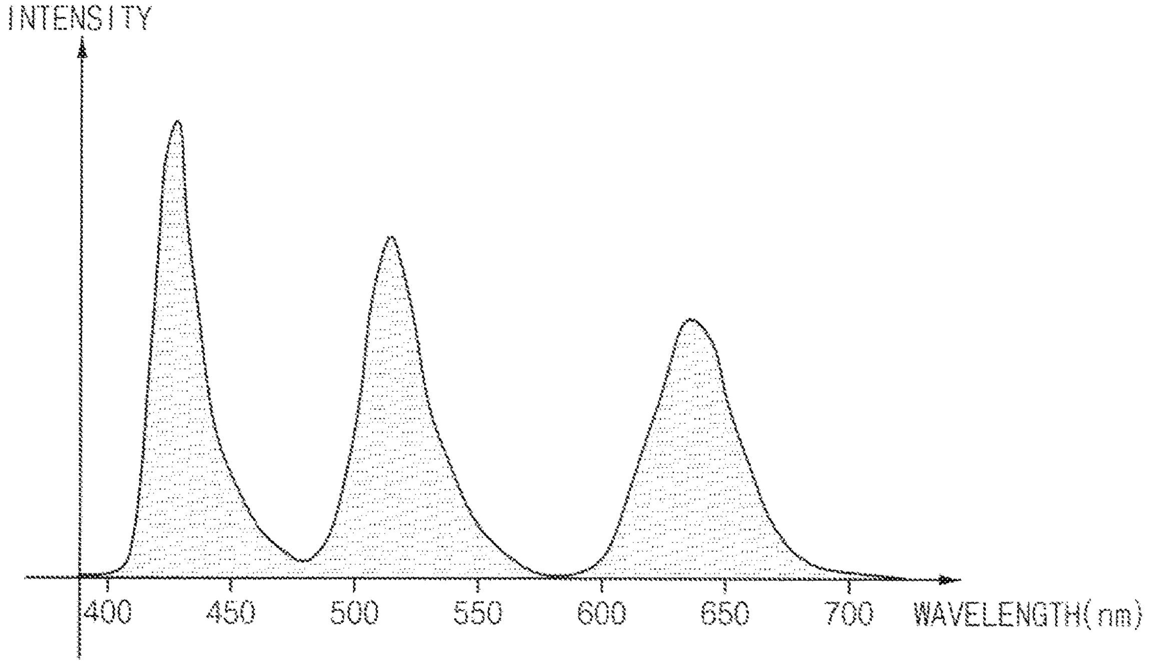
FIG. 9 is a graph showing a spectrum of white light measured in region I of FIG. 4.
Figure 10:
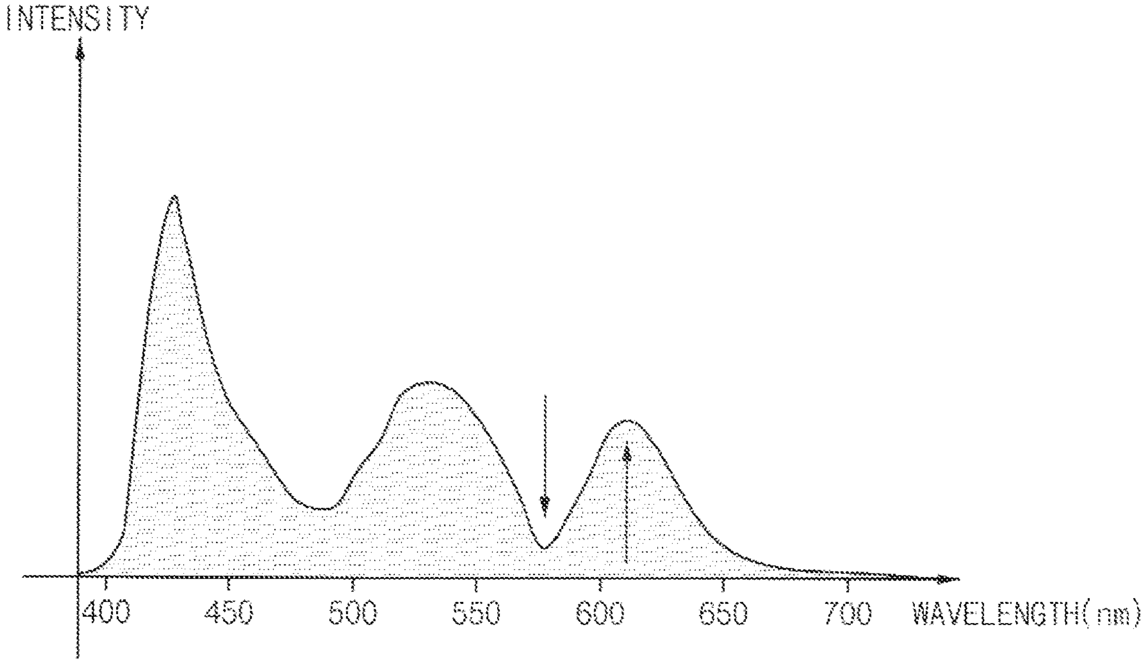
FIG. 10 is a graph showing a spectrum of white light measured in region II of FIG. 4.

FIG. 7 is a graph showing a transmittance of light based on wavelength bands measured in region II of FIG. 4. FIG. 8 is a graph showing a reflectivity of light based on wavelength bands measured in region II of FIG. 4. FIG. 9 is a graph showing a spectrum of white light measured in region I of FIG. 4. FIG. 10 is a graph showing a spectrum of white light measured in region II of FIG. 4.

Referring to FIGS. 4 and 7, in the region II, a transmittance of light was measured based on wavelength bands. A1 is a result of measuring the transmittance in case that the first thickness TH1 of the light absorption filter LAF is about 0.5 um. A2 is a result of measuring the transmittance in case that the first thickness TH1 of the light absorption filter LAF is about 1.5 um.

For A1, the transmittance of light having a wavelength of about 550 nm was measured to be about 82%, and the transmittance of light having a wavelength of about 600 nm was measured to be about 40%. The transmittance of light having a wavelength less than about 500 nm was measured to be greater than or equal to about 80%, and the transmittance of light having a wavelength greater than about 620 nm was measured to be greater than or equal to about 80%.

For example, as the color reinforcement pattern CR includes the second red quantum dots RQD2 and the light absorption filter LAF mainly absorbs light having a wavelength range of about 550 nm to about 620 nm, the transmittance of light having a wavelength in a range of about 550 nm to about 620 nm was reduced. As the color reinforcement pattern CR includes the second red quantum dots RQD2 and the light absorption filter LAF mainly absorbs light having a wavelength in a range of about 550 nm to about 620 nm, the transmittance of light having a wavelength less than about 500 nm or greater than about 620 nm was maintained relatively high.

For A2, the transmittance of light having a wavelength of about 550 nm was measured to be about 60%, and the transmittance of light having a wavelength of about 600 nm was measured to be about 10%. The transmittance of light having a wavelength less than about 500 nm was measured to be greater than about 80%, and the transmittance of light having a wavelength greater than about 650 nm was measured to be greater than about 80%.

For example, the transmittance of light having a wavelength in a range of about 550 nm to about 600 nm was measured to be less than or equal to about 60%, and the transmittance of light having a wavelength less than about 500 nm or greater than about 650 nm was measured to be greater than or equal to about 80%.

For example, as the color reinforcement pattern CR includes the second red quantum dots RQD2 and the light absorption filter LAF mainly absorbs light having a wavelength range of about 550 nm to about 620 nm, the transmittance of light having a wavelength in a range of about 550 nm to about 620 nm was reduced. As the color reinforcement pattern CR includes the second red quantum dots RQD2 and the light absorption filter LAF mainly absorbs light having a wavelength in a range of about 550 nm to about 620 nm, the transmittance of light having a wavelength less than about 500 nm or greater than about 620 nm was maintained relatively high.

As the first thickness TH1 of the light absorption filter LAF increases, the transmittance of light having a wavelength of about 550 nm to about 620 nm was further reduced.

Referring to FIGS. 4 and 8, in the region II, a reflectivity of light was measured based on the wavelength band.

The reflectivity of light having a wavelength of about 550 nm was measured to be about 4%, the reflectivity of light having a wavelength of about 600 nm was measured to be about 0%, and the reflectivity of light having a wavelength of about 620 nm was measured to be about 5%. For example, the reflectivity of light having a wavelength in a range of about 550 nm to about 620 nm was measured to be less than or equal to about 10%.

For example, as the color reinforcement pattern CR includes the second red quantum dots RQD2 and the light absorption filter LAF mainly absorbs light having a wavelength range of about 550 nm to about 620 nm, the reflectivity of light having a wavelength in a range of about 550 nm to about 620 nm was reduced.

Referring to FIG. 9, the spectrum of white light measured in the region I has peaks in a wavelength band in a range of about 400 nm to about 450 nm (e.g., a wavelength band of blue light), a wavelength band in a range of about 500 nm to about 550 nm (e.g., a wavelength band of green light), and a wavelength band in a range of about 620 nm to about 680 nm (e.g., a wavelength band of red light). The spectrum of white light measured in the region I has a lowest point in a wavelength band in a range of about 580 nm to about 620 nm (e.g., a wavelength band of yellow light).

For example, the spectrum of white light emitted from the region I has peaks in a blue wavelength band, a green wavelength band, and a red wavelength band, and has a lowest point in the yellow wavelength band.

Referring to FIG. 10, the spectrum of white light measured in region II has peaks in a wavelength band in a range of about 400 nm to about 450 nm (e.g., a wavelength band of blue light), a wavelength band in a range of about 500 nm to about 550 nm (e.g., a wavelength band of green light), and a wavelength band in a range of about 620 nm to about 680 nm (e.g., a wavelength band of red light). The spectrum of white light measured in region II has a lowest point in a wavelength band in a range of about 580 nm to about 620 nm (e.g., a wavelength band of yellow light).

As the display device 1000 includes the color reinforcement pattern CR in the region II, the white light measured in the region II may have a peak in a wavelength band in a range of about 620 nm to about 680 nm (e.g., a wavelength band of red light). As the display device 1000 includes the light absorption filter LAF in the region II, the white light measured in the region II may have the lowest point in a wavelength range of about 580 nm to about 620 nm (e.g., a wavelength band of yellow light).

As shown in FIGS. 9 and 10, the spectrum of white light measured in the region II may be substantially similar to the white light spectrum measured in the region I. Accordingly, the color coordinate deviation between the color coordinates of the light emitted from the region I and the color coordinates of the light emitted from the region II may be reduced.

Figure 11:
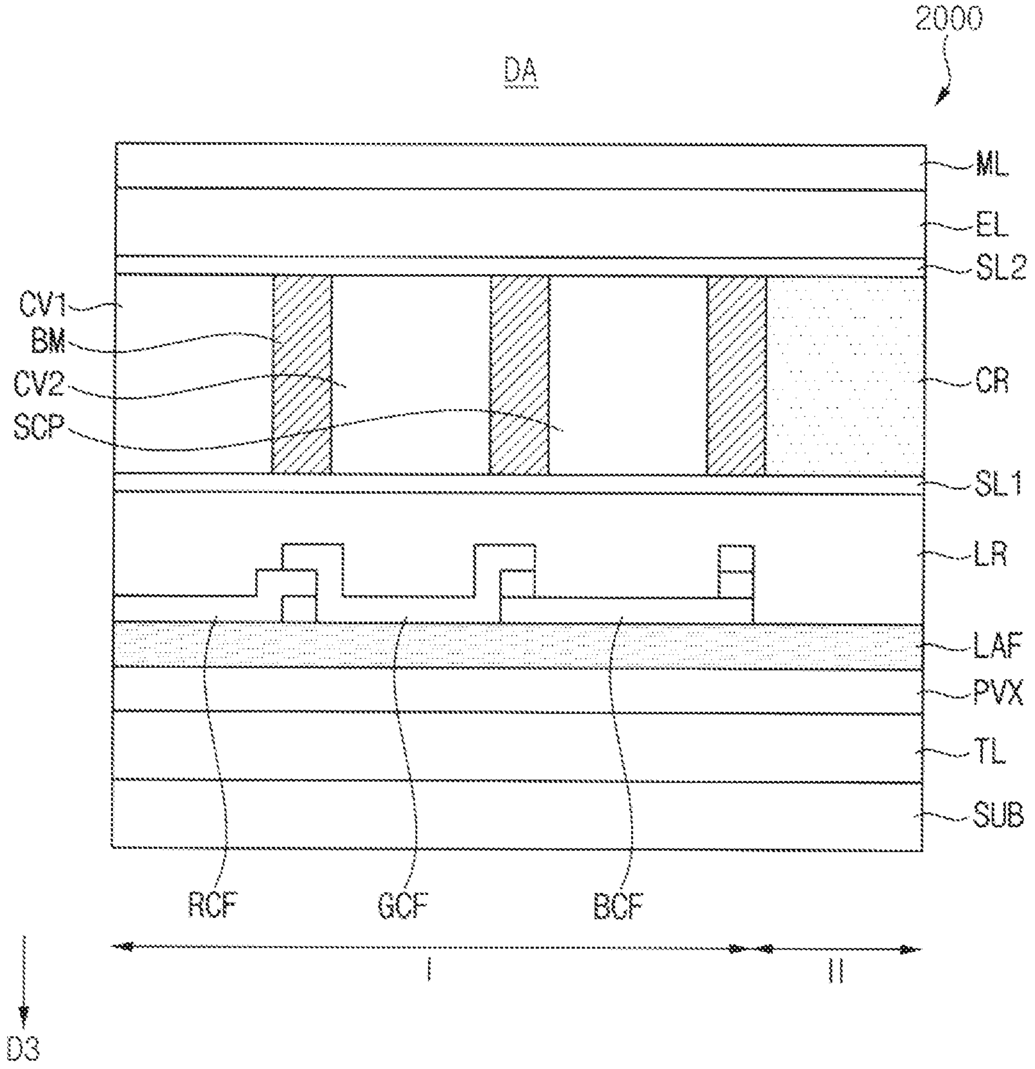
FIG. 11 is a schematic cross-sectional view illustrating a display device according to an embodiment of the disclosure.

FIG. 11 is a schematic cross-sectional view illustrating a display device according to an embodiment of the disclosure.

Referring to FIG. 11, a display device 2000 according to an embodiment may include the substrate SUB, the transistor layer TL, the passivation layer PVX, a light absorption filter LAF, the first color filter RCF, the second color filter GCF, the third color filter BCF, a low refractive index layer LR, the first separation layer SL1, the light blocking pattern BM, the first color conversion pattern CV1, the second color conversion pattern CV2, the scattering pattern SCP, the color reinforcement pattern CR, the second separation layer SL2, the emission layer EL, and the metal layer ML.

The display device 2000 may be substantially the same as the display device 1000 described with reference to FIG. 4, except for the light absorption filter LAF and the low refractive index layer LR.

The light absorption filter LAF may be disposed on the passivation layer PVX. In an embodiment, the light absorption filter LAF may be disposed on an entire area of the passivation layer PVX. For example, the light absorption filter LAF may be disposed under the first color filter RCF, the second color filter GCF, and the third color filter BCF, and may overlap the first color filter RCF, the second color filter GCF, and the third color filter BCF. The light absorption filter LAF may also overlap the color reinforcement filter CR.

The first color filter RCF may be disposed between the light absorption filter LAF and the first color conversion pattern CV1, the second color filter GCF may be disposed between the light absorption filter LAF and the second color conversion pattern CV2, and the third color filter BCF may be disposed between the light absorption filter LAF and the scattering pattern SCP.

The low refractive index layer LR may be disposed on the light absorption filter LAF. In an embodiment, the low refractive index layer LR may be disposed on an entire area of the light absorption filter LAF. For example, the low refractive index layer LR may overlap the first color filter RCF, the second color filter GCF, and the third color filter BCF, and may cover the first color filter RCF, the second color filter GCF, and the third color filter BCF.

Figure 12:
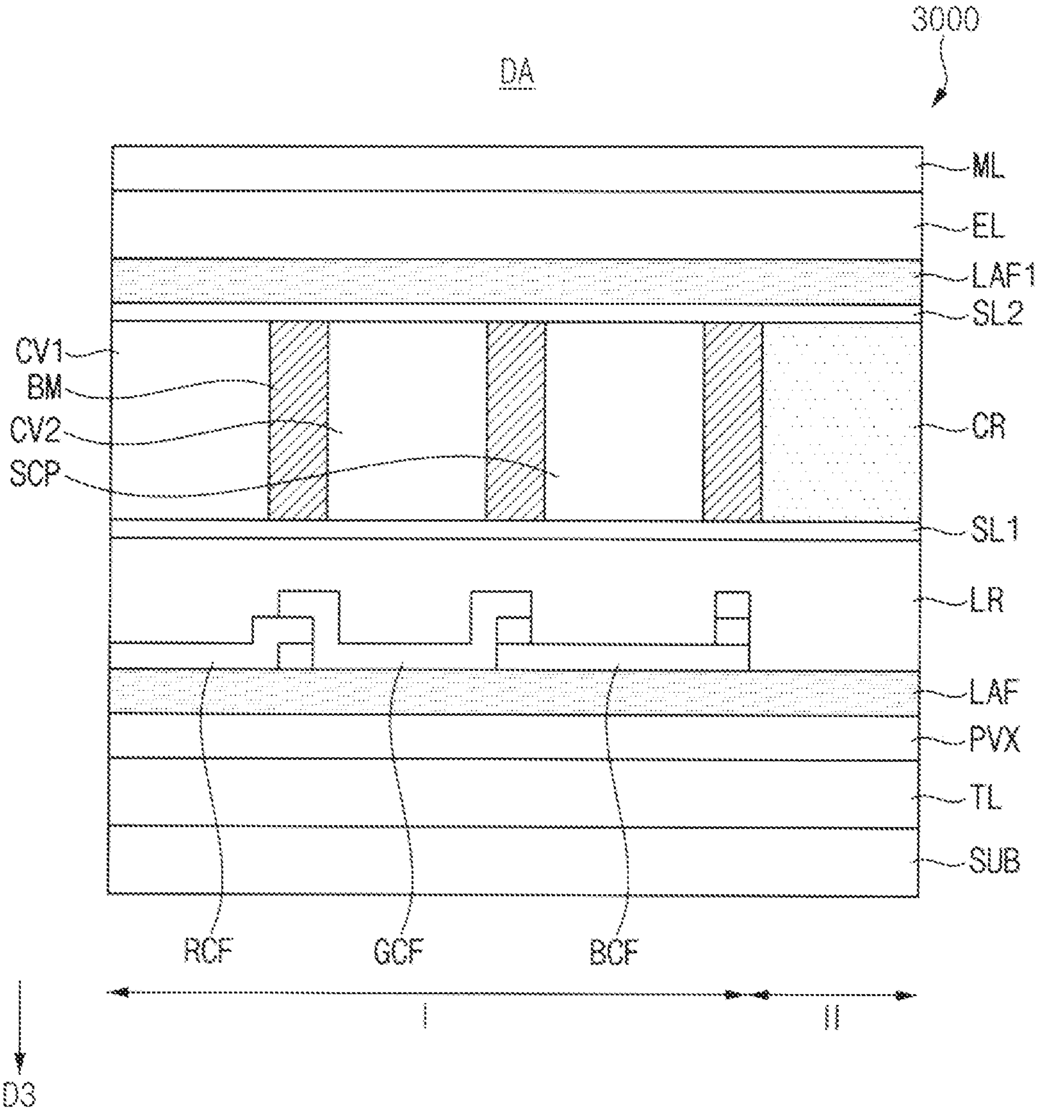
FIG. 12 is a schematic cross-sectional view illustrating a display device according to an embodiment of the disclosure.

FIG. 12 is a schematic cross-sectional view illustrating a display device according to an embodiment of the disclosure.

Referring to FIG. 12, a display device 3000 according to an embodiment may include the substrate SUB, the transistor layer TL, the passivation layer PVX, the light absorption filter LAF, the first color filter RCF, the second color filter GCF, the third color filter BCF, the low refractive layer LR, the first separation layer SL1, the light blocking pattern BM, the first color conversion pattern CV1, the second color conversion pattern CV2, the scattering pattern SCP, the color reinforcement pattern CR, the second separation layer SL2, the auxiliary light absorption filter LAF1, the emission layer EL, and the metal layer ML.

The display device 3000 may be substantially the same as the display device 2000 described with reference to FIG. 11, except for the auxiliary light absorption filter LAF1.

In an embodiment, the auxiliary light absorption filter LAF1 may be disposed between the color reinforcement pattern CR and the emission layer EL. For example, the auxiliary light absorption filter LAF1 may be disposed on an entire area of the second separation layer SL2. The auxiliary light absorption filter LAF1 and the light absorption filter LAF may include the same material.

Figure 13:
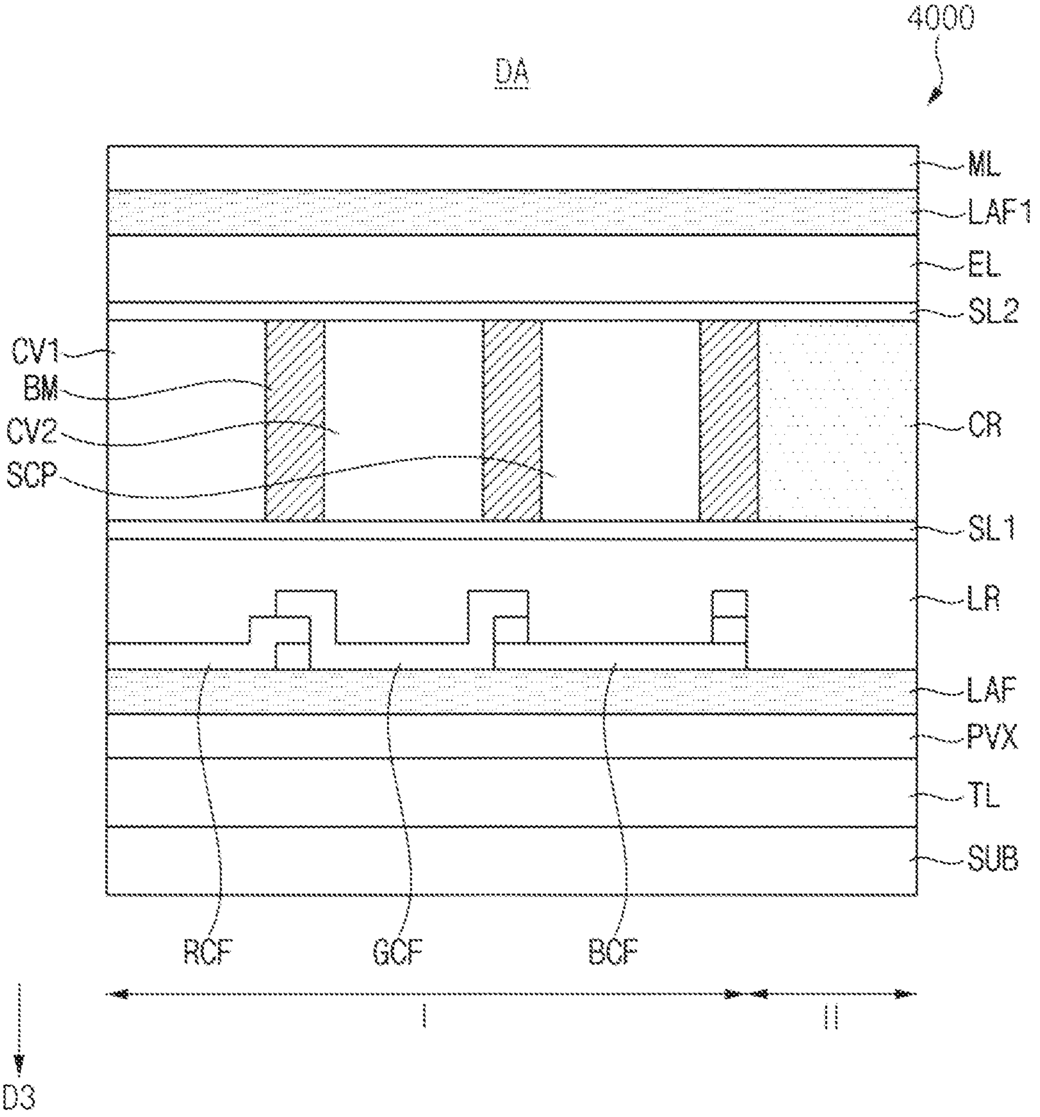
FIG. 13 is a schematic cross-sectional view illustrating a display device according to an embodiment of the disclosure.

FIG. 13 is a schematic cross-sectional view illustrating a display device according to an embodiment of the disclosure.

Referring to FIG. 13, a display device 4000 according to an embodiment may include the substrate SUB, the transistor layer TL, the passivation layer PVX, the light absorption filter LAF, the first color filter RCF, the second color filter GCF, the third color filter BCF, the low refractive layer LR, the first separation layer SL1, the light blocking pattern BM, the first color conversion pattern CV1, the second color conversion pattern CV2, the scattering pattern SCP, the color reinforcement pattern CR, the second separation layer SL2, an auxiliary light absorption filter LAF1, the emission layer EL, and the metal layer ML.

The display device 4000 may be substantially the same as the display device 2000 described with reference to FIG. 11, except for the auxiliary light absorption filter LAF1.

In an embodiment, the auxiliary light absorption filter LAF1 may be disposed on an entire area of the emission layer EL. For example, the auxiliary light absorption filter LAF1 may be disposed between the emission layer EL and the metal layer ML. The auxiliary light absorption filter LAF1 and the light absorption filter LAF may include the same material.

Figure 14:
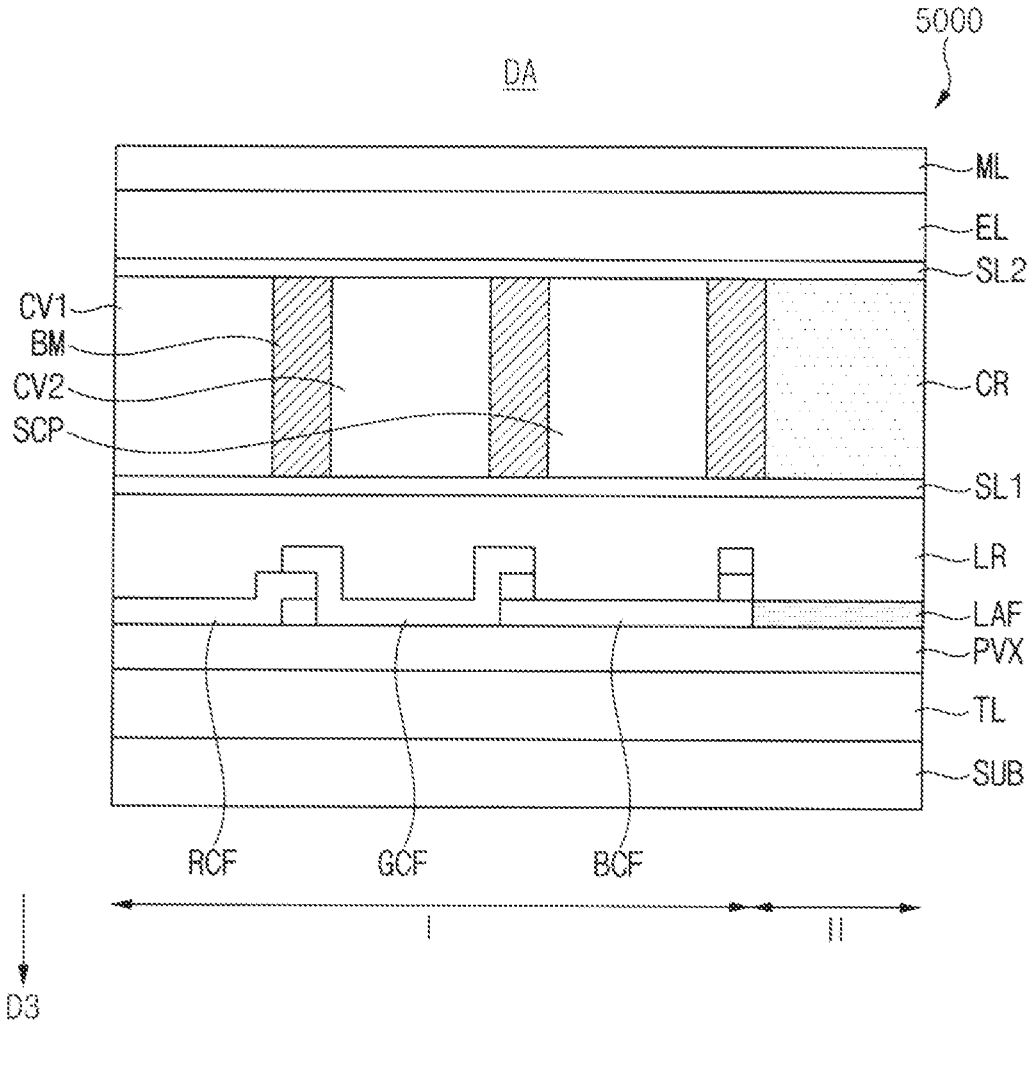
FIG. 14 is a schematic cross-sectional view illustrating a display device according to an embodiment of the disclosure.

FIG. 14 is a schematic cross-sectional view illustrating a display device according to an embodiment of the disclosure.

Referring to FIG. 14, a display device 5000 according to an embodiment may include the substrate SUB, the transistor layer TL, the passivation layer PVX, the first color filter RCF, the second color filter GCF, the third color filter BCF, a light absorption filter LAF, a low refractive index layer LR, the first separation layer SL1, the light blocking pattern BM, the first color conversion pattern CV1, the second color conversion pattern CV2, the scattering pattern SCP, the color reinforcement pattern CR, the second separation layer SL2, the emission layer EL, and the metal layer ML.

The display device 5000 may be substantially the same as the display device 1000 described with reference to FIG. 4, except for the light absorption filter LAF and the low refractive index layer LR.

The light absorption filter LAF may be disposed on the passivation layer PVX. In an embodiment, the light absorption filter LAF may overlap the color reinforcement pattern CR. Accordingly, the color coordinate deviation between the color coordinates of the light emitted from the region I and the color coordinates of the light emitted from the region II may be reduced.

The light absorption filter LAF may not overlap the first to third color filters RCF, GCF, and BCF. For example, the light absorption filter LAF may be formed by patterning. Accordingly, light efficiency in the region I may be improved.

The low refractive index layer LR may be disposed on the first color filter RCF, the second color filter GCF, the third color filter BCF, and the light absorption filter LAF. For example, the low refractive index layer LR may overlap the first color filter RCF, the second color filter GCF, the third color filter BCF, and the light absorption filter LAF, and may cover the first color filter RCF, the second color filter GCF, the third color filter BCF, and the light absorption filter LAF.

Figure 15:
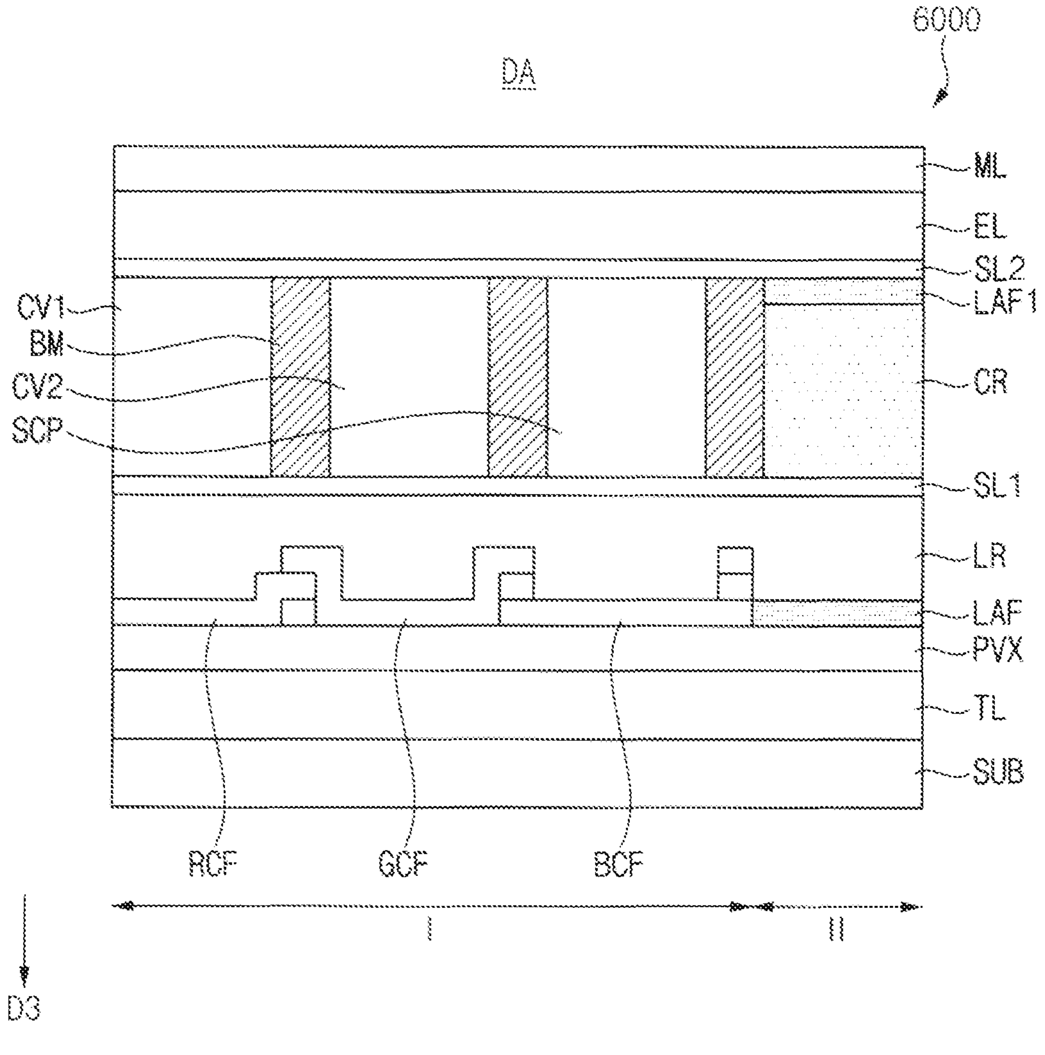
FIG. 15 is a schematic cross-sectional view illustrating a display device according to an embodiment of the disclosure.

FIG. 15 is a schematic cross-sectional view illustrating a display device according to an embodiment of the disclosure.

Referring to FIG. 15, a display device 6000 according to an embodiment may include the substrate SUB, the transistor layer TL, the passivation layer PVX, the first color filter RCF, the second color filter GCF, the third color filter BCF, the light absorption filter LAF, the low refractive index layer LR, the first separation layer SL1, the light blocking pattern BM, the first color conversion pattern CV1, the second color conversion pattern CV2, the scattering pattern SCP, the color reinforcement pattern CR, an auxiliary light absorption filter LAF1, the second separation layer SL2, the emission layer EL, and the metal layer ML.

The display device 6000 may be substantially the same as the display device 5000 described with reference to FIG. 14, except for the auxiliary light absorption filter LAF1.

The auxiliary light absorption filter LAF1 may be disposed between the color reinforcement pattern CR and the emission layer EL. In an embodiment, the auxiliary light absorption filter LAF1 may overlap the light absorption filter LAF and the color enhancement pattern CR. Accordingly, the color coordinate deviation between the color coordinates of the light emitted from the region I and the color coordinates of the light emitted from the region II may be reduced.

The auxiliary light absorption filter LAF1 may not overlap the first to third color filters RCF, GCF, and BCF. For example, the auxiliary light absorption filter LAF1 may be formed by patterning. Accordingly, light efficiency in the region I may be improved.

Figure 16:
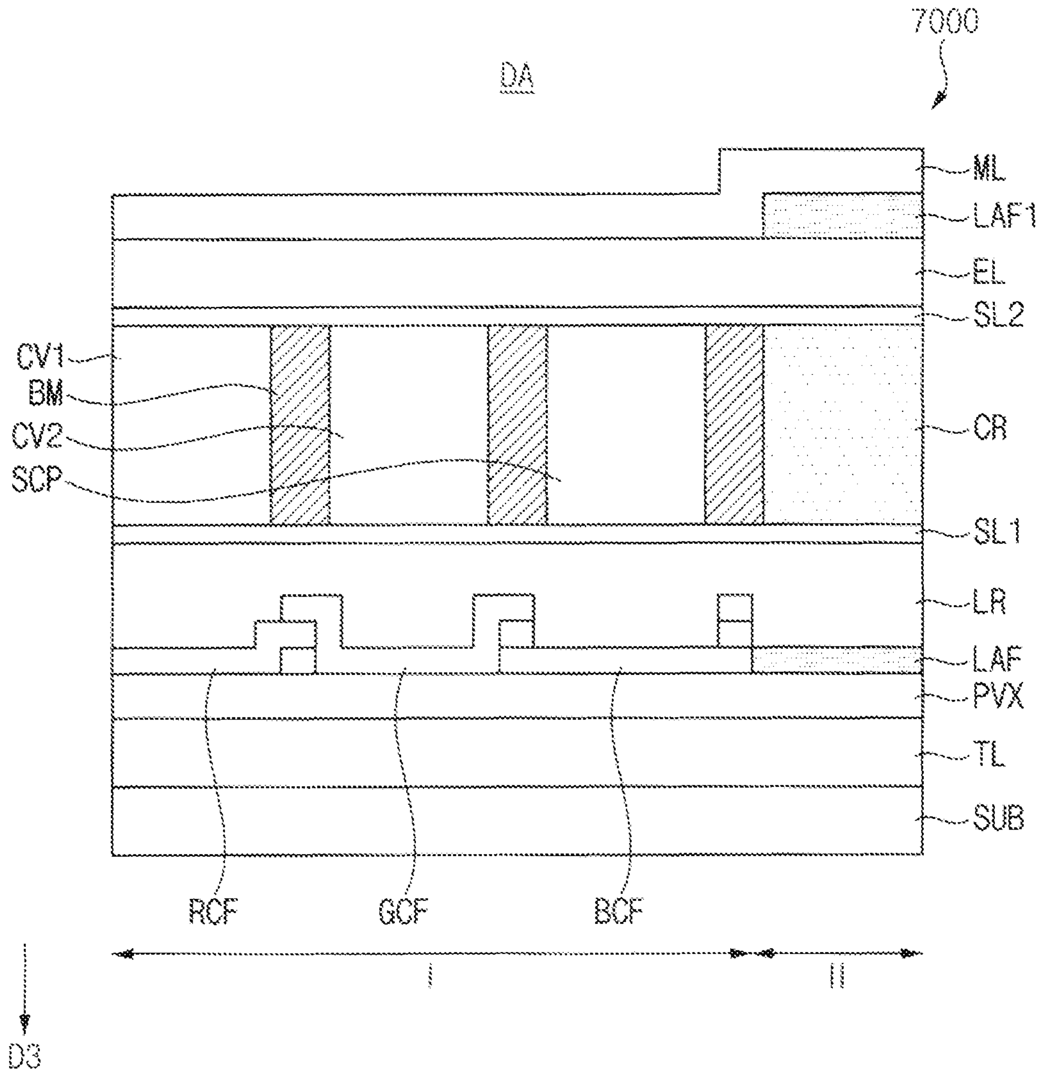
FIG. 16 is a schematic cross-sectional view illustrating a display device according to an embodiment of the disclosure.

FIG. 16 is a schematic cross-sectional view illustrating a display device according to an embodiment of the disclosure.

Referring to FIG. 16, a display device 7000 according to an embodiment may include the substrate SUB, the transistor layer TL, the passivation layer PVX, the first color filter RCF, the second color filter GCF, the third color filter BCF, the light absorption filter LAF, the low refractive index layer LR, the first separation layer SL1, the light blocking pattern BM, the first color conversion pattern CV1, the second color conversion pattern CV2, the scattering pattern SCP, the color reinforcement pattern CR, the second separation layer SL2, the emission layer EL, an auxiliary light absorption filter LAF1, and the metal layer ML.

The display device 7000 may be substantially the same as the display device 5000 described with reference to FIG. 14, except for the auxiliary light absorption filter LAF1.

The auxiliary light absorption filter LAF1 may be disposed on the emission layer EL. For example, the auxiliary light absorption filter LAF1 may be disposed between the emission layer EL and the metal layer ML. In an embodiment, the auxiliary light absorption filter LAF1 may overlap the light absorption filter LAF and the color reinforcement pattern CR. Accordingly, the color coordinate deviation between the color coordinates of the light emitted from the region I and the color coordinates of the light emitted from the region II may be reduced.

The auxiliary light absorption filter LAF1 may not overlap the first to third color filters RCF, GCF, and BCF. For example, the auxiliary light absorption filter LAF1 may be formed by patterning. Accordingly, light efficiency in the region I may be improved.

Figure 17:
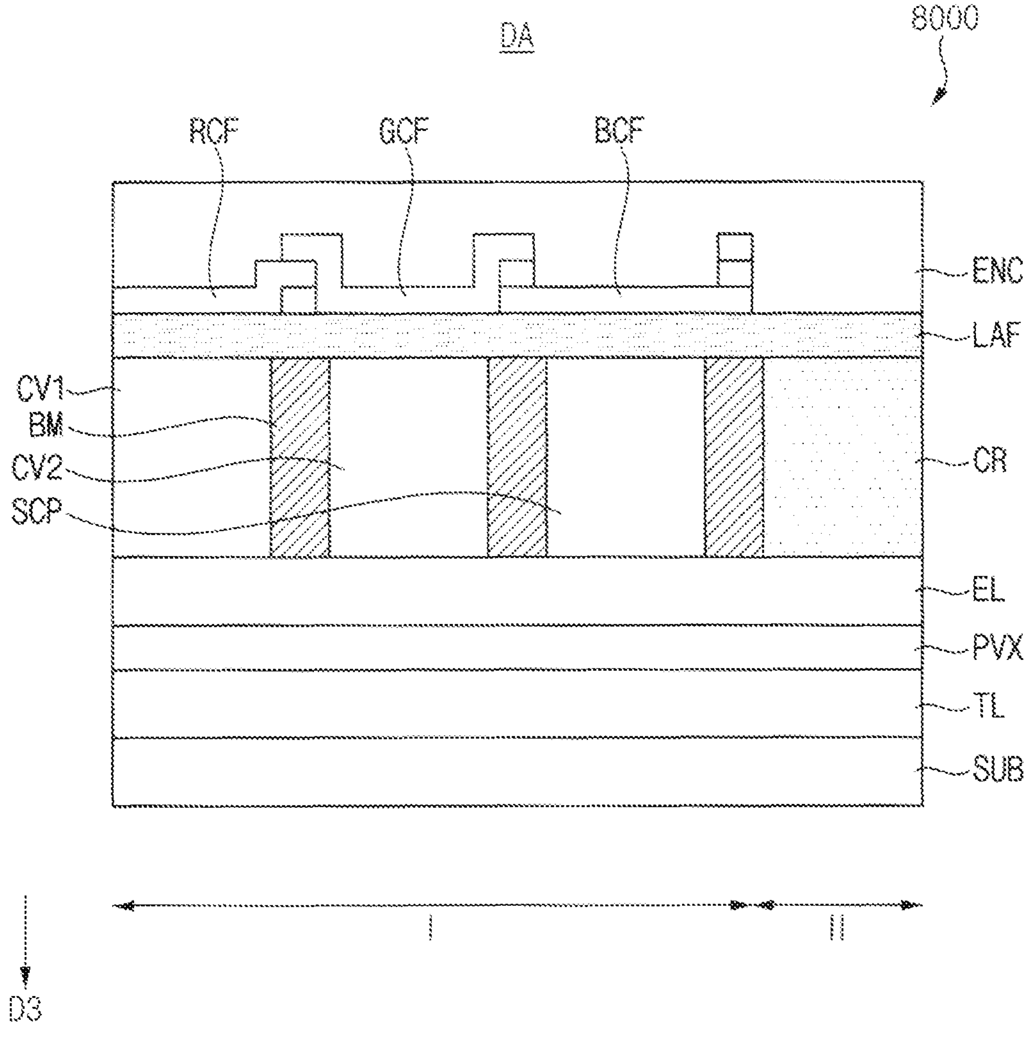
FIG. 17 is a schematic cross-sectional view illustrating a display device according to an embodiment of the disclosure.

FIG. 17 is a schematic cross-sectional view illustrating a display device according to an embodiment of the disclosure.

Referring to FIG. 17, a display device 8000 according to an embodiment may include the substrate SUB, the transistor layer TL, the passivation layer PVX, an emission layer EL, the light blocking pattern BM, the first color conversion pattern CV1, the second color conversion pattern CV2, the scattering pattern SCP, the color reinforcement pattern CR, a light absorption filter LAF, the first color filter RCF, the second color filter GCF, the third color filter BCF, and an encapsulation layer ENC.

In an embodiment, the light emitted from the emission layer EL may travel in a direction opposite to the third direction D3. For example, light emitted from the emission layer EL may sequentially pass through the color reinforcement pattern CR, the light absorption filter LAF, and the encapsulation layer ENC. For example, the display device 8000 may be a top emission type display device.

The emission layer EL may be disposed on the passivation layer PVX. The emission layer EL may emit light. For example, the emission layer EL may have a structure in which a first organic emission layer emitting blue light, a second organic emission layer emitting blue light, a third organic emission layer emitting blue light, and a fourth organic emission layer emitting green light are sequentially stacked.

The light blocking pattern BM may be disposed on the emission layer EL. The light blocking pattern BM may include openings, and the first color conversion pattern CV1, the second color conversion pattern CV2, the scattering pattern SCP, and the color reinforcement pattern CR may be disposed in the openings, respectively.

The first color conversion pattern CV1, the second color conversion pattern CV2, the scattering pattern SCP, and the color reinforcement pattern CR may be disposed on the emission layer EL.

The light absorption filter LAF may be disposed on the first color conversion pattern CV1, the second color conversion pattern CV2, the scattering pattern SCP, and the color reinforcement pattern CR. In an embodiment, the light absorption filter LAF may be integrally formed so the light absorption filter LAF overlaps the first color conversion pattern CV1, the second color conversion pattern CV2, the scattering pattern SCP, and the color reinforcement pattern CR.

The first color filter RCF, the second color filter GCF, and the third color filter BCF may be disposed on the light absorption filter LAF. The first color filter RCF, the second color filter GCF, and the third color filter BCF may overlap the first color conversion pattern CV1, the second color conversion pattern CV2, and the scattering patterns SCP, respectively.

The encapsulation layer ENC may be disposed on the light absorption filter LAF. The encapsulation layer ENC may cover the first color filter RCF, the second color filter GCF, and the third color filter BCF.

Figure 18:
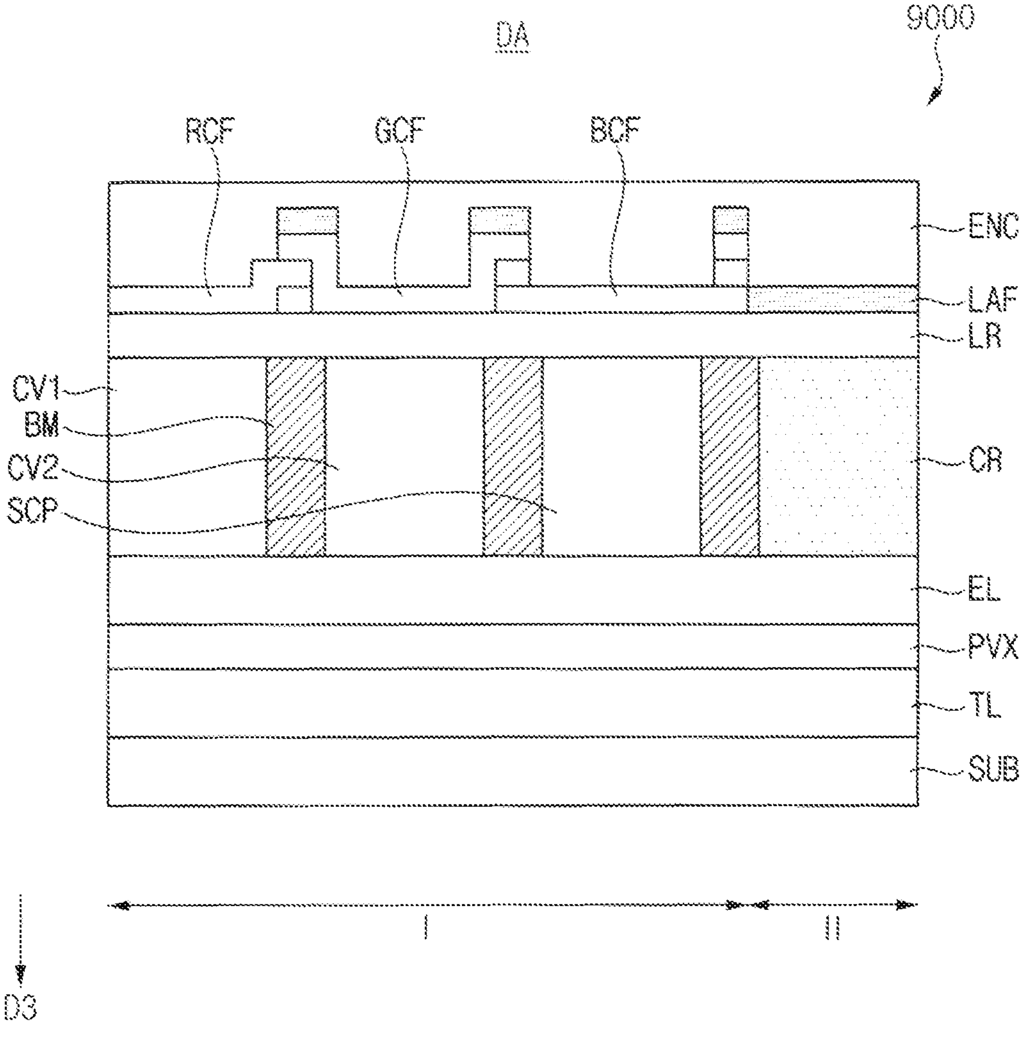
FIG. 18 is a schematic cross-sectional view illustrating a display device according to an embodiment of the disclosure.

FIG. 18 is a schematic cross-sectional view illustrating a display device according to an embodiment of the disclosure.

Referring to FIG. 18, a display device 9000 according to an embodiment may include the substrate SUB, the transistor layer TL, the passivation layer PVX, the emission layer EL, the light blocking pattern BM, the first color conversion pattern CV1, the second color conversion pattern CV2, the scattering pattern SCP, the color reinforcement pattern CR, a low refractive layer LR, the first color filter RCF, the second color filter GCF, the third color filter BCF, a light absorption filter LAF, and the encapsulation layer ENC.

The display device 9000 may be substantially the same as the display device 8000 described with reference to FIG. 17, except for the low refractive index layer LR and the light absorption filter LAF.

The low refractive index layer LR may be disposed on the first color conversion pattern CV1, the second color conversion pattern CV2, the scattering pattern SCP, and the color reinforcement pattern CR. In an embodiment, the low refractive index layer LR may be integrally formed so the low refractive index layer LR overlaps the first color conversion pattern CV1, the second color conversion pattern CV2, the scattering pattern SCP, and the color enhancement pattern CR.

The light absorption filter LAF may be disposed on the low refractive index layer LR. In an embodiment, the light absorption filter LAF may overlap the color reinforcement pattern CR. Accordingly, the color coordinate deviation between the color coordinates of the light emitted from the region I and the color coordinates of the light emitted from the region II may be reduced.

The light absorption filter LAF may not overlap the first to third color filters RCF, GCF, and BCF. For example, the light absorption filter LAF may be formed by patterning. Accordingly, light efficiency in the region I may be improved.

Although embodiments have been disclosed for illustrative purposes, those skilled in the art will appreciate that various modifications, additions and substitutions are possible, without departing from the scope and spirit of the disclosure as disclosed in the accompanying claims and their equivalents.

What is claimed is:

1. A display device comprising:

a color conversion pattern disposed on a substrate and including first red quantum dots;

a color reinforcement pattern disposed on the substrate adjacent to the color conversion pattern and including second red quantum dots, a monomer, and a dispersant; and an emission layer disposed on the color reinforcement pattern, wherein a concentration of the second red quantum dots in the color reinforcement pattern is less than a concentration of the first red quantum dots in the color conversion pattern, and wherein the color reinforcement pattern and the color conversion pattern do not overlap each other in a plan view.

2. The display device of claim 1, wherein the concentration of the second red quantum dots in the color reinforcement pattern is in a range of about 1 wt % to about 40 wt %.

3. The display device of claim 1, wherein the monomer includes at least one selected from the group consisting of an epoxy-based monomer and an ester-based monomer.

4. The display device of claim 3, wherein a terminal of the monomer includes at least one selected from the group consisting of acrylate, diacrylate, and methacrylate.

5. The display device of claim 3, wherein a surface energy of the monomer is in a range of about 1 dyne/cm to about 30 dyne/cm.

6. The display device of claim 3, wherein a viscosity of the monomer is in a range of about 1 cps to about 40 cps.

7. The display device of claim 1, wherein the dispersant includes at least one selected from the group consisting of polyacrylate polymer, polyurethane polymer, and polyethylene polymer.

8. The display device of claim 1, wherein the second red quantum dots and the first red quantum dots include a same material.

9. The display device of claim 1, wherein a thickness of the color reinforcement pattern in a cross-sectional view is in a range of about 1 um to about 15 um.

10. The display device of claim 1, further comprising:
a light absorption filter disposed between the substrate and the color reinforcement pattern and absorbing light in a wavelength band.

11. The display device of claim 10, wherein the wavelength band is in a range of about 550 nm to about 620 nm.

12. The display device of claim 10, wherein the light absorption filter includes a dipyrromethene-based compound.

13. The display device of claim 12, wherein the light absorption filter further includes particles formed of an inorganic material.

14. The display device of claim 13, wherein a refractive index of the light absorption filter is less than a refractive index of the color reinforcement pattern.

15. The display device of claim 10, wherein a thickness of the light absorption filter in a cross-sectional view is in a range of about 1 um to about 10 um.

16. The display device of claim 10, wherein the light absorption filter overlaps the color reinforcement pattern in a plan view.

17. The display device of claim 16, wherein a transmittance of light having a wavelength in a range of about 550 nm to about 600 nm in a region where the color reinforcement pattern and the light absorption filter overlap is less than or equal to about 60%.

18. The display device of claim 17, wherein a transmittance of light having a wavelength less than about 500 nm or greater than about 650 nm in the region where the color reinforcement pattern and the light absorption filter overlap is greater than or equal to about 80%.

19. The display device of claim 16, wherein a reflectivity of light having a wavelength in a range of about 550 nm to about 600 nm in a region where the color reinforcement pattern and the light absorption filter overlap is less than or equal to about 10%.

20. The display device of claim 10, further comprising:
a color filter disposed between the substrate and the color conversion pattern,
wherein the light absorption filter is disposed on the color filter and overlaps the color conversion pattern and the color reinforcement pattern in a plan view.

21. The display device of claim 10, further comprising:
a color filter disposed between the light absorption filter and the color conversion pattern; and
a low refractive layer disposed on the color filter,
wherein the light absorption filter overlaps the color conversion pattern and the color reinforcement pattern in a plan view.

22. The display device of claim 21, further comprising:
an auxiliary light absorption filter disposed between the color reinforcement pattern and the emission layer.

23. The display device of claim 21, further comprising:
an auxiliary light absorption filter disposed on the emission layer.

24. The display device of claim 10, further comprising:
a color filter disposed between the substrate and the color conversion pattern,
wherein the light absorption filter overlaps the color reinforcement pattern in a plan view and does not overlap the color filter in the plan view.

25. The display device of claim 24, further comprising:
an auxiliary light absorption filter disposed between the color reinforcement pattern and the emission layer.

26. The display device of claim 24, further comprising:
an auxiliary light absorption filter disposed on the emission layer and overlapping the light absorption filter in the plan view; and
a metal layer disposed on the emission layer and covering the auxiliary light absorption filter.

27. A display device comprising:
a light absorption filter disposed on a substrate and absorbing light in a wavelength band;
a color conversion pattern disposed on the light absorption filter and including first red quantum dots;
a color reinforcement pattern disposed on the light absorption filter adjacent to the color conversion pattern and including second red quantum dots, a monomer, and a dispersant; and
an emission layer disposed on the color pattern, wherein a concentration of the second red quantum dots in the color reinforcement pattern is less than a concentration of the first red quantum dots in the color conversion pattern, and
wherein the color reinforcement pattern and the color conversion pattern do not overlap each other in a plan view.

28. The display device of claim 27, wherein the wavelength band is in a range of about 550 nm to about 650 nm.

29. The display device of claim 27, wherein the light absorption filter includes a dipyrromethene-based compound.

* * * * *